United States Patent [19]

Hamasaki

[11] Patent Number: 4,996,581
[45] Date of Patent: Feb. 26, 1991

[54] BIPOLAR TRANSISTOR

[75] Inventor: Toshihiko Hamasaki, Yokohama, Japan

[73] Assignee: Kabushiki Kaisha Toshiba, Kawasaki, Japan

[21] Appl. No.: 305,026

[22] Filed: Feb. 2, 1989

[30] Foreign Application Priority Data

Feb. 3, 1988 [JP] Japan .................. 63-23010

[51] Int. Cl.⁵ .................. H01L 21/225; H01L 21/265; H01L 21/20
[52] U.S. Cl. ........................ 357/34; 437/31; 357/35; 357/59; 357/71; 357/65
[58] Field of Search ............ 357/34, 35, 65, 59, 357/71

[56] References Cited

U.S. PATENT DOCUMENTS

| 4,532,003 | 7/1985 | Beasom | 357/34 |
| 4,571,817 | 2/1986 | Birritella et al. | 357/34 |
| 4,639,761 | 1/1987 | Singer et al. | 357/37 |
| 4,644,383 | 2/1987 | Alcasu | 357/50 |
| 4,662,062 | 5/1987 | Toyooka et al. | 437/31 |
| 4,692,348 | 9/1987 | Rubloff et al. | 437/82 |
| 4,706,378 | 11/1987 | Havemann | 357/34 |
| 4,729,965 | 3/1988 | Tamaki et al. | 437/162 |
| 4,752,817 | 6/1988 | Lechaton et al. | 357/34 |
| 4,835,596 | 5/1989 | Werner | 357/43 |
| 4,839,305 | 6/1989 | Brighton | 357/34 |

FOREIGN PATENT DOCUMENTS

| 0004292 | 10/1979 | European Pat. Off. | 357/34 |
| 0096155 | 12/1983 | European Pat. Off. | |
| 2570879 | 3/1986 | France | 357/34 |
| 0153775 | 11/1981 | Japan | 357/34 |
| 3834223 | 4/1989 | Netherlands | |

OTHER PUBLICATIONS

Extended abstracts of the 19th Conference on Solid State Devices and Materials (1987) pp. 331-334. S. Konaka et al.

Primary Examiner—Andrew J. James
Assistant Examiner—Viet Q. Nguyen
Attorney, Agent, or Firm—Oblon, Spivak, McClelland, Maier & Neustadt

[57] ABSTRACT

A bipolar transistor including an emitter region of a first conductivity type, having a predetermined width, an inner base region of a second conductivity type, formed below the emitter region and contacting the emitter region, thus forming a PN junction, an outer base region of the second conductivity type, having a high impurity concentration, set in ohmic contact with the edge of the inner base region and surrounding the inner base region, an inner collector region of the first conductivity type, formed below the inner base region and contacting the inner base region, thus forming a PN junction, and an outer collector region of the first conductivity type, set in ohmic contact with the inner collector region, contacting the lower surface of the outer base region, thus forming a PN junction, and surrounding the inner collector region. The transistor is characterized in the following respects. First, the inner collector region has a higher impurity concentration than the outer collector region. Second, the edge of the inner collector region is located right below, or inner than, the edge of the emitter region. Third, the upper surface of the inner collector region is higher and closer to the emitter region, than the upper surface of the outer collector region.

6 Claims, 11 Drawing Sheets

BIPOLAR TRANSISTOR

BACKGROUND OF THE INVENTION

1. Field of the Invention

The present invention relates to a bipolar transistor for use in an integrated circuit, and more particularly to a bipolar transistor which has an improved operating characteristics in a moderate-injection region.

2. Description of the Related Art

To manufacture a semiconductor device of a high integration density, such as VLSI (Very Large-Scale Integration) circuit, bipolar transistors must be used which operate at high speed and consumes a little power. In recent years, various structures for such bipolar transistors, and various methods of manufacturing such bipolar transistors have been proposed.

There are two points essential to a high-speed, low-power consumption bipolar transistor. First, the transistor should have a shallow vertical junction. Second, the transistor should be small in terms of the horizontal direction. Detrimental to the operating speed of a bipolar transistor is the so-called "Kirk effect" the phenomenon that the apparent depth of the base region increases in proportion to the current injected to the transistor. Hence, it is important to suppress the Kirk effect in order to raise the operating speed of the bipolar transistor.

Of the prior-art publications concerned with high-speed, low-power consumption bipolar transistors, a few will be discussed which seem to be relevant to this invention.

Figure 1:
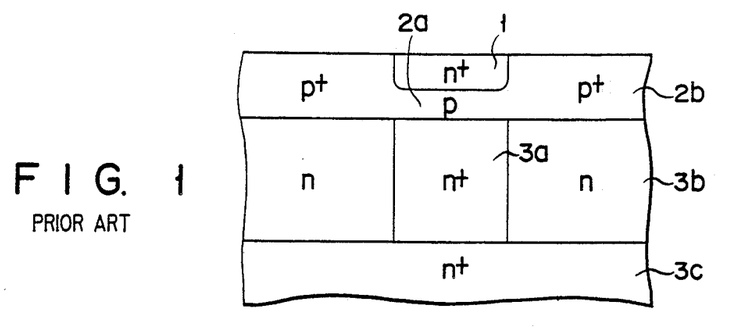
FIGS. 1 and 2 are cross sectional views schematically showing two conventional bipolar transistors, respectively.

Japanese Patent Publication No. 51-5763 discloses a planer bipolar transistor. As is shown in FIG. 1, this bipolar transistor comprises emitter region 1, inner base region 2a, outer base region 2b, inner collector region 3a, outer collector region 3b, and buried collector region 3c. The structures of collector regions 3a, 3b, and 3c characterize this bipolar transistor. Internal collector region 2a is located below emitter region 1 and has the same width as emitter region 1. External collector region 3b has a higher resistance than inner collector region 3a, and surrounds inner collector region 3a. Collector regions 3a and 3b have their upper surfaces flush with each other. The buried collector region 3c has a low resistance and a high impurity concentration, is located right below inner collector region 3a and outer collector region 3b, and contacting both collector regions 3a and 3b.

Figure 2:
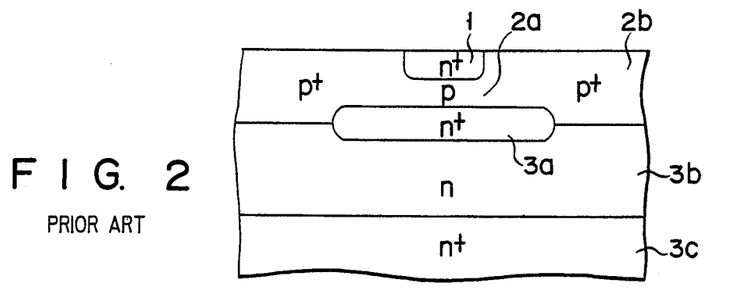

Konaka et al. disclose a planer bipolar transistor of the structure shown in FIG. 2, in their thesis A 20ps/G Si Bipolar IC Using Advanced SST with Collector Ion Implantation, the proceedings for 19th Conference on Solid State Devices and Materials, pp. 331-334. In FIG. 2, the same reference numerals are used to denote the same elements as those shown in FIG. 1. This bipolar transistor also comprises inner collector region 3a, outer collector region 3b, and buried collector region 3c. The transistor is different from the transistor shown in FIG. 1 in two respects. First, inner collector region 3a and buried collector region 3c are set apart from each other, and outer collector region 3b is interposed between these regions 3a and 3c. Secondly, inner collector region 3a has a width broader than that of emitter region 1.

In either bipolar transistor, inner collector region 3a serves to suppress the Kirk effect. More precisely, region 3a, which has a relatively high impurity concentration, prevents the holes accumulated in inner base region 2a from moving into collector region 3b to cause the Kirk effect.

Both conventional bipolar transistors described above are disadvantageous in the following respects.

First, these transistors operate at low speed in a moderate-injection region. This is because inner collector region 3a having a relatively high impurity concentration contacts inner base region 2a, and the base/collector junction has a larger junction capacitance than in the case where internal collector region 3a is not interposed between regions 2b and 3b.

Second any circuit including transistors of either type has a long delay time. The cross section of the boundary between inner base region 2a and outer base region 2b depends upon the height of inner collector region 3a. To reduce the depth of inner base region 2a, the upper surface of inner collector region 3a must be raised. The higher the upper surface of region 3a, the narrower the carrier path between inner base region 2a and outer base region 2b. Hence, when the upper surface of region 3a is raised, the series resistance between the inner and outer base regions will increase, inevitably prolonging the delay time of the transistor.

SUMMARY OF THE INVENTION

The object of the present invention is to provide a bipolar transistor which has an inner collector region having a relatively high impurity concentration, for suppressing the Kirk effect, and which can operate at high speed even in a moderate-injection region.

According to the invention, there is provided a bipolar transistor which comprises:

an emitter region of a first conductivity type, having a predetermined width;

an inner base region of a second conductivity type, formed below the emitter region and contacting the emitter region, thus forming a PN junction;

an outer base region of the second conductivity type, having a high impurity concentration, set in ohmic contact with the edge of the inner base region and surrounding the inner base region;

an inner collector region of the first conductivity type, formed below the inner base region and contacting the inner base region, thus forming a PN junction;

an outer collector region of the first conductivity type, set in ohmic contact with the edge of the inner collector region, contacting the lower surface of the outer base region, thus forming a PN junction, and surrounding the inner collector region; and a buried collector region of the first conductivity type, having a high impurity concentration, formed below the inner and outer collector region, and set in ohmic contact with the lower ends of the outer collector region and the inner collector region, wherein the inner collector region has a higher impurity concentration than the outer collector region, the edge of the inner collector region is located right below, or inner than, the edge of the emitter region, and the upper surface of the inner collector region is higher and closer to the emitter region, than the upper surface of the outer collector region.

In the bipolar transistor, the inner collector region is connected to the buried collector region. Nonetheless these regions can be separated from each other, and the outer collector region can be interposed between the inner collector region and the buried collector region. If this is the case, the transistor can be easily manufactured by the existing planer process, as will be understood from the embodiments described hereinafter.

Further, in the bipolar transistor according to this invention, the parasitic capacitance of the base/collector junction is reduced, and the Kirk effect is sufficiently suppressed. Therefore, the transistor has a very high switching speed. In particular, it operates at high speed in the moderate-injection region.

DETAILED DESCRIPTION OF THE PREFERRED EMBODIMENTS

Figure 3:
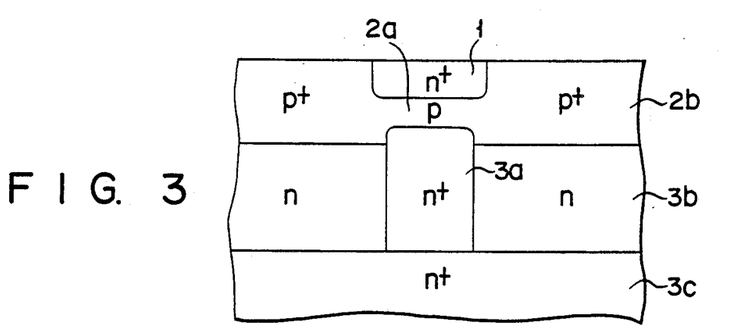
FIG. 3 is a cross sectional views schematically showing a bipolar transistor according to a first embodiment of the present invention.

FIG. 3 is a cross sectional views schematically showing a bipolar transistor according to the first embodiment of the invention. To make it easy to understand the differences between this bipolar transistor and the conventional ones illustrated in FIGS. 1 and 2, the same numerals are used in FIG. 3 to designate the same elements as those shown in FIGS. 1 and 2. As is evident from FIG. 3, the bipolar transistor comprises emitter region 1, inner base region 2a, outer base region 2b, inner collector region 3a, outer collector region 3b, and buried collector region 3c. As can be understood from FIG. 3, this bipolar transistor is characterized in two respects. First, inner collector region 3a is less broad than emitter region 1, and is located inner than emitter region 1. Secondly, the upper surface of inner collector region 3a is higher than that of outer collector region 3b; in other words, region 3a protrudes upward from region 3b. The bipolar transistor is the same as the bipolar transistor shown in FIG. 1 in any other respect.

Inner collector region 3a serves to suppress the Kirk effect. Also, region 3a, which is less broad than emitter region 1, reduces the parasitic capacitance of the PN junction formed between region 3a and inner base region 2a. In addition, since the upper surface of outer collector region 3b is lower than that of inner collector region 3a, the carrier path extending from inner base region 2a to outer base region 2b is sufficient broad. Thus, the base resistance of the transistor is low, whereby the transistor has a short delay time.

Figure 4A:
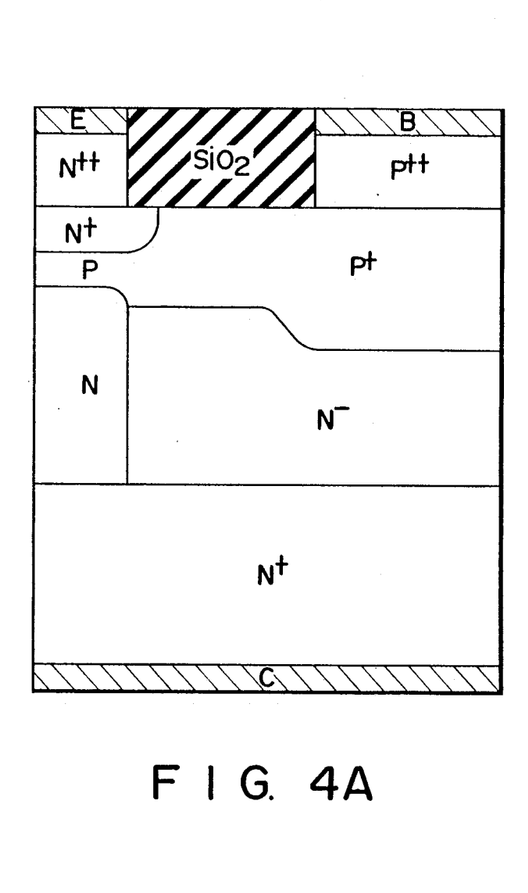
FIG. 4A is a diagram showing the structure of a bipolar transistor, which has been used in computer simulation for studying the operating characteristics of the bipolar transistor illustrated in FIG. 3.
Figure 4B:
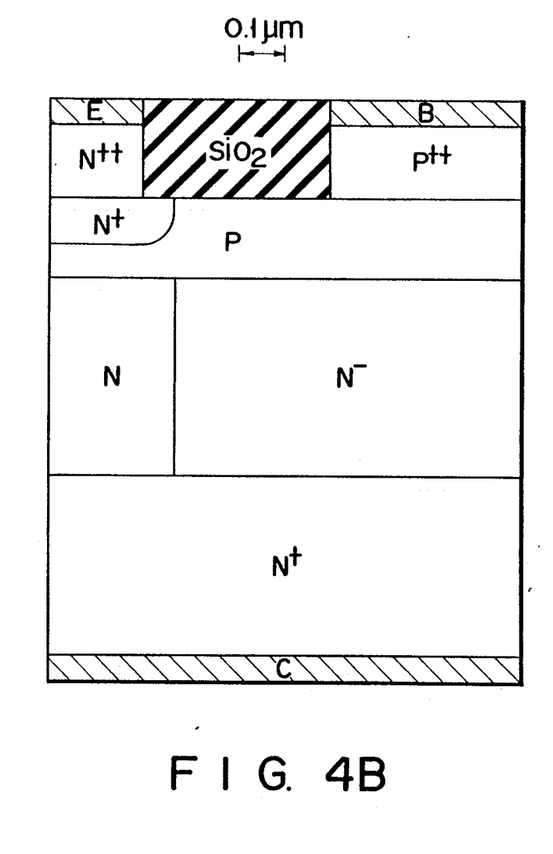
FIG. 4B is a diagram showing the structure of a bipolar transistor, which has been used in computer simulation for studying the operating characteristics of the bipolar transistor illustrated in FIG. 1.
Figure 5:
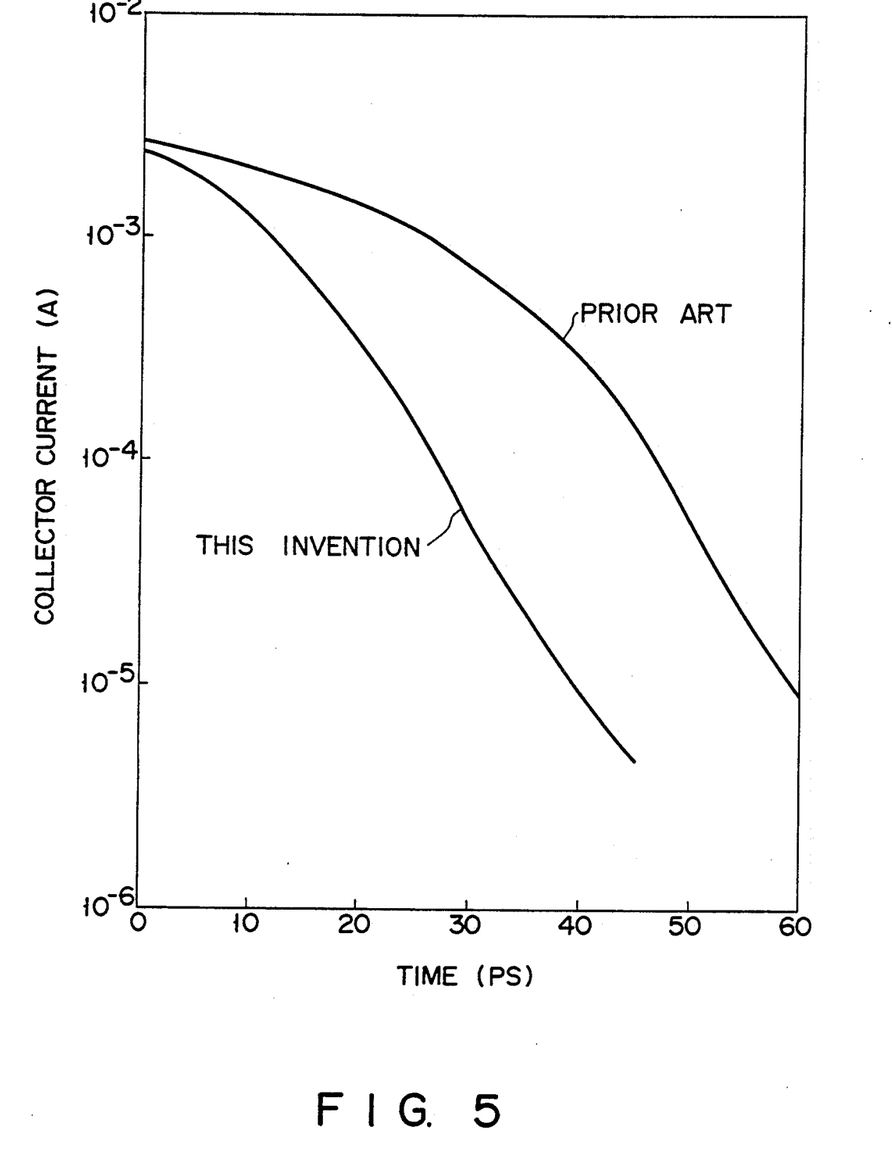
FIG. 5 is a graph representing the results of the computer simulations conducted on the structures shown in FIGS. 4A and 4B.

To demonstrate the advantages of the bipolar transistor shown in FIG. 1, which has been specified in the preceding paragraph, two-dimensional device simulation was performed by a computer on the bipolar transistors shown in FIGS. 1 and 3, thereby evaluating the OFF characteristics of these transistors. To be more precise, the computer simulation was carried out on the transistor shown in FIG. 4A which is structurally identical to the transistor shown in FIG. 3, and on the transistor shown in FIG. 4B which is structurally identical to the conventional transistor shown in FIG. 1. The results of the simulation were as is represented in the graph of FIG. 5. FIG. 5 shows the collector current change when emitter-base voltage ($V_{BE}$) is changed rapidly from 1.0 V to 0.5 V within 4PS while maintaining emitter-collector voltage at a constant value ($V_{CE}=2.0$). As FIG. 5 clearly shows, the bipolar transistor illustrated in FIG. 3 has an excellent collector-current characteristic.

In the computer simulation, Schokley-Read-Hall (SRH) recombination and Auger recombination were implemented. SRH and Auger recombinations become dominant in the impurity-doping range of $10^{16}$ to $10^{18}$ cm$^{-3}$ and the impurity-doping range of $10^{18}$ to $10^{20}$ cm$^{-3}$, respectively. Bandgap narrowing, due to the heavy doping effect, was also implemented in the computer simulation.

The time dependent current-continuity equations were solved by backward differential method, using socalled decoupled (or Gummel) method, followed by the coupled (or Newton) method, until potential change of less than 1 microvolt and a carrier concentration change of 0.01% were achieved. The time increment was set at a constant value so that the difference in calculated electrode current between the two cases decreased to 4%, twice of the value and a half of it.

The second embodiment of the present invention will now be described with reference to FIGS. 6, 7A, 7B, 8A, and 8B.

Figure 6:
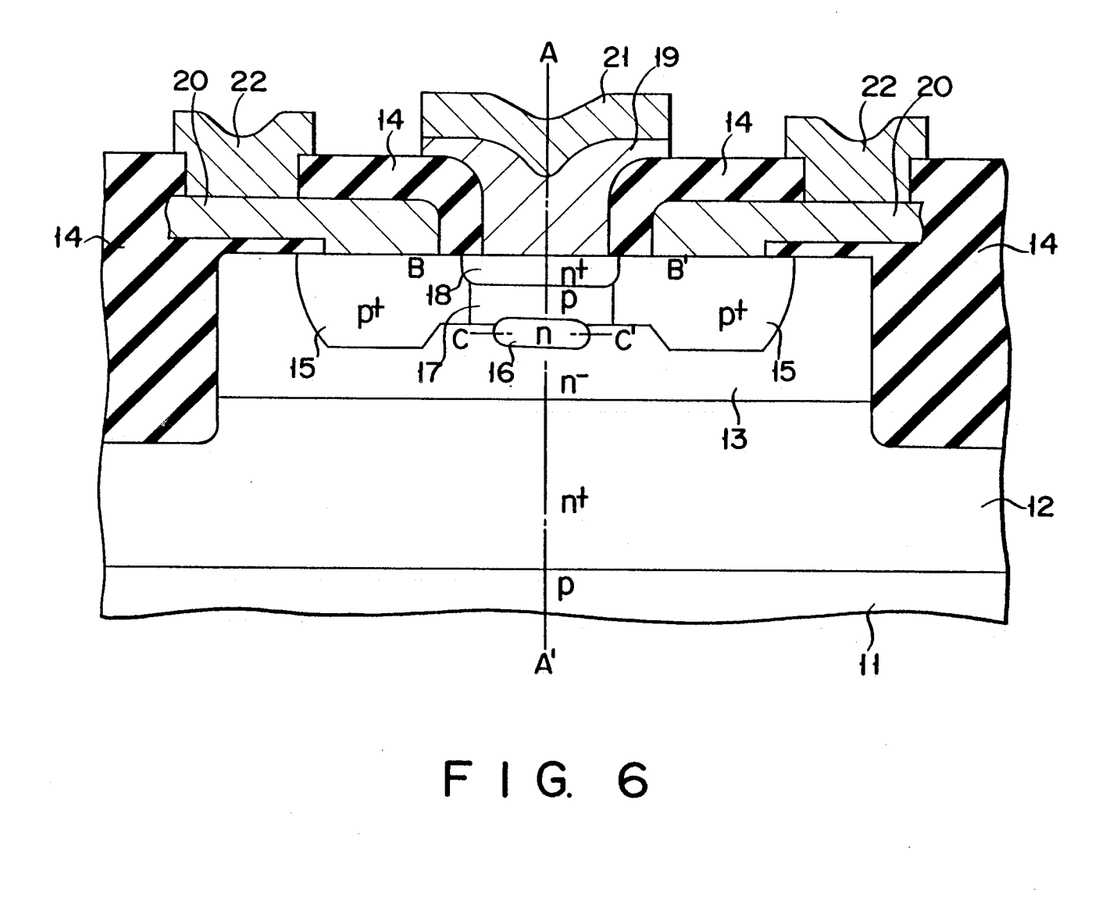
FIG. 6 is a cross-sectional view showing a bipolar transistor according to a second embodiment of the present invention.

FIG. 6 is a cross-sectional view showing the bipolar transistor according to the second embodiment. As is shown in this figure, the bipolar transistor comprises P-type silicon substrate 11, N+-type buried collector region 12 formed on substrate 11, and N--type outer collector region 13 formed on buried collector region 12. A portion of buried collector region 12, and outer collector region 13 are shaped like islands as is illustrated in FIG. 6. SiO$_2$ film 14 surrounds the island-shaped portion of region 12 and outer collector region 13. P+-type outer base region 15, N+-type inner collector region 16, P-type inner base region 17, and N+-type emitter region 18 are formed in outer collector region 13. Inner base region 17 is located below emitter region 18, and these regions 17 and 18 form a PN junction. Outer base region 15 surrounds the edges of inner base region 17 and emitter region 18; it is set in ohmic contact with inner base region 17 and forms an PN junction jointly with emitter region 18. Inner collector region 16 is formed between inner base region 17 and outer collector region 13. Region 16 is isolated from buried collector region 12.

As is the first embodiment (FIG. 3), inner collector region 16 is less broad than emitter region 18, and the upper surface of inner collector region 16 is higher than that of outer collector region 13. Hence, region 13 is, so to speak, hollowed out, deepening inner base region 17.

As is illustrated in FIG. 6, the bipolar transistor further comprises polycrystalline silicon layer 19 formed in contact with emitter region 18, and polycrystalline silicon layer 20 formed in contact outer base region 15. The transistor also has emitter electrode 21 and base electrode 22, both made of metal and formed on layers 19 and 20, respectively.

Figure 7A:
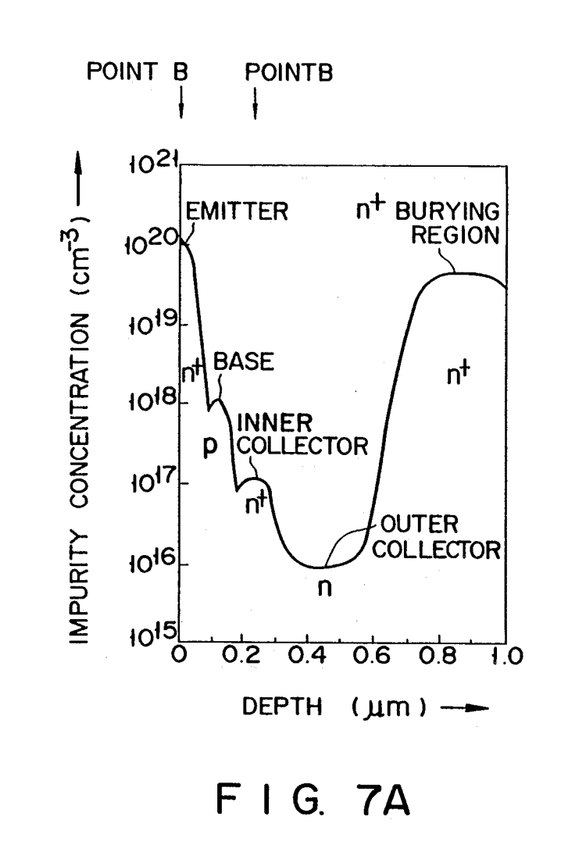
FIG. 7A is a graph showing the impurity profile in the cross section taken along line A-A' in FIG. 6.
Figure 7B:
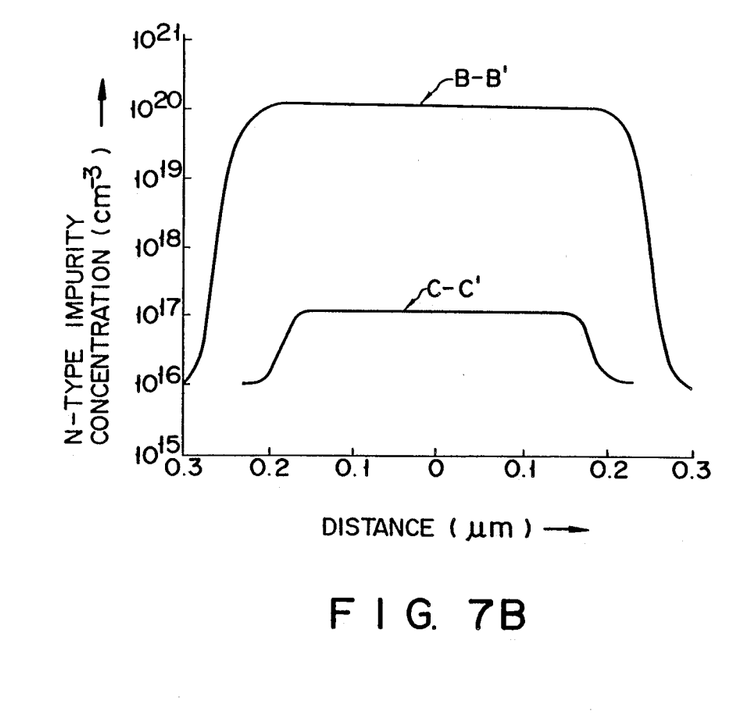
FIG. 7B is a graph showing the impurity profiles in two cross sections taken along line B-B' and lien C-C' in FIG. 6.

FIG. 7A represents the profile of the impurity concentration in the section of the transistor, taken along line A-A' in FIG. 6. As this figure shows, buried collector region 12 has a higher impurity concentration than inner collector region 16, which in turn has a higher impurity concentration than outer collector region 13. FIG. 7B show the profiles of the impurity concentration in two section of the transistor (i.e., the horizontal profile of emitter region 18 and the horizontal profile of inner collector region 16), taken along line B-B' and line C-C' in FIG. 6. As is evident from FIG. 7B, inner collector region 16 is less broad than emitter region 18, and is hence located inner than emitter region 18.

Also in the transistor shown in FIG. 6, inner collector region 16 suppresses the Kirk effect. Moreover, the transistor has the same advantages as the transistor shown in FIG. 3. More specifically, since inner collector region 16 is less broad than emitter region 18, the parasitic capacitance between the inner and outer base regions is small. Also, since the carrier path, which extends from inner base region 17 to outer base region 15 is sufficiently broad, the base resistance is low, and the transistor has but a short delay time.

In order to ascertain that the second embodiment (FIG. 6) has these advantages, computer simulation was carried out on the second embodiment in the same way as on the first embodiment shown in FIG. 3. The bipolar transistor put to the simulation had an emitter region having a width of 0.4 μm. The computer simulation was also carried out on a bipolar transistor used as a controller and structurally identical to the bipolar transistor illustrated in FIG. 1.

Figure 8A:
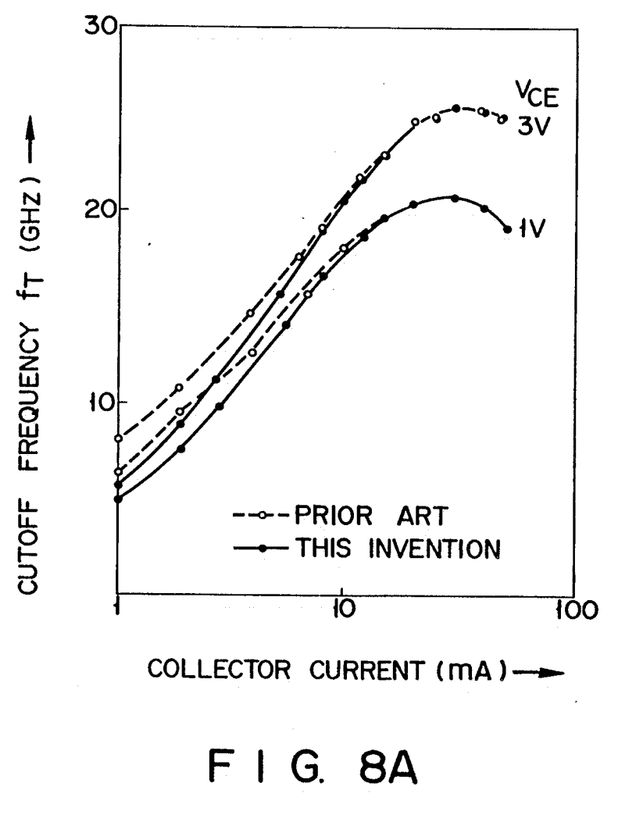
FIG. 8A is a graph showing one operating characteristic of the bipolar transistor shown in FIG. 6 and a conventional bipolar transistor.

FIG. 8A is a graph representing the results of the computer simulation, i.e., the collector-current dependency of the cutoff frequency of either bipolar transistor. As can be understood from FIG. 8A, in the moderate-injection region, the transistor shown in FIG. 6 has a cutoff frequency higher than that of the prior art transistor shown in FIG. 1. In the highinjection region, no considerable difference is seen between the cutoff frequencies of the two transistors compared. This means that, when the Kirk effect occurs in that portion of the collector region which is located right below emitter region 18, excessive carriers will be fast charged in or discharged from this portion of the collector region.

Figure 8B:
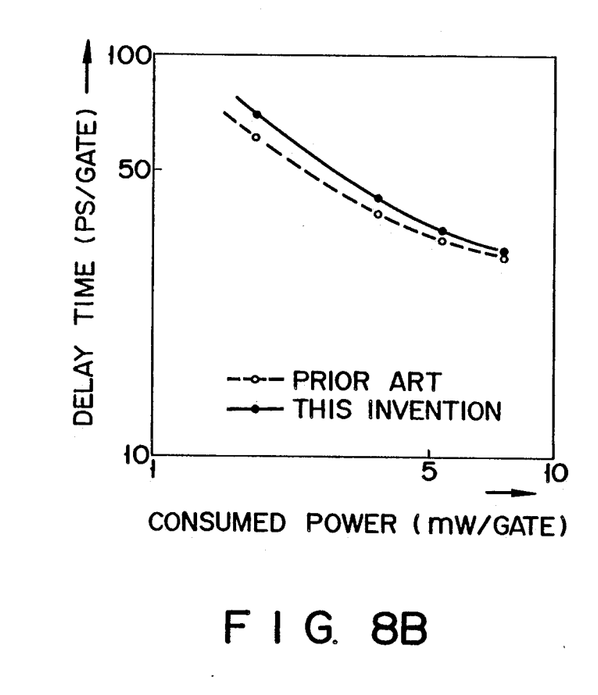
FIG. 8B is also a graph illustrating another operating characteristic of the bipolar transistor shown in FIG. 6 and a conventional bipolar transistor.

FIG. 8B shows the results of the computer simulation performed on two 51-stage, emitter-coupled logic circuits, respectively using the bipolar transistor shown in FIG. 6 and the conventional one shown in FIG. 1, thereby studying the relationship between the power consumed and the gate delay time. As is evident from FIG. 8B, the bipolar transistor shown in FIG. 6 can form a logic gate which operates at a speed much higher than the logic gate made of the prior art bipolar transistor (FIG. 1), since it has a lower base resistance and a higher cutoff frequency in the moderate-injection region.

As has been described, in the bipolar transistor shown in FIG. 6, inner collector region 16 is isolated from buried collector region 12. Therefore, this transistor can be easily manufactured by a planer process. Two examples of the planer process of manufacturing the bipolar transistor will be explained with reference to FIGS. 9A to 9L and FIGS. 10A to 10C. It should be noted that the transistor manufactured by either example is not completely identical in structure to the one illustrated in FIG. 6. For instance, the transistor has neither an isoplanar structure nor a buried collector region. Nonetheless, the following examples are believed to enable one skilled in the art can produce the transistor shown in FIG. 6 on the basis of the following examples, since both the isoplanar structure and the buried collector region can be formed by the known process.

EXAMPLE 1

Figure 9A:
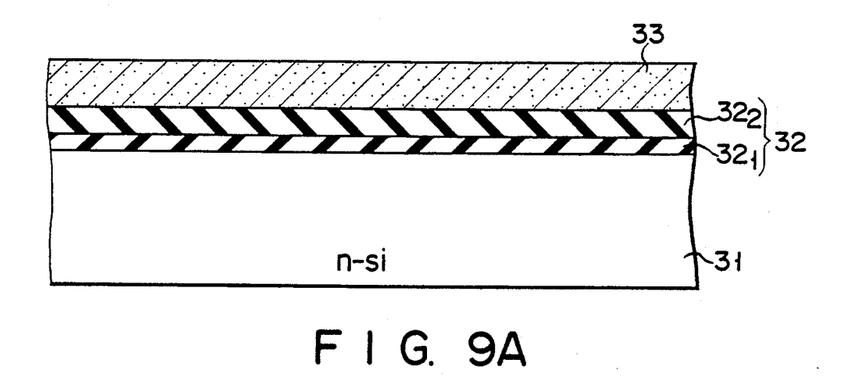
FIGS. 9A to 9L are cross sectional views explaining a method of manufacturing the bipolar transistor shown in FIG. 6.

First, as is shown in FIG. 9A, insulating film 32 is formed on N-type epitaxial silicon substrate 31, and first polycrystalline silicon layer 33, boron-doped and 4000 Å thick, is formed on insulating film 32 by means of chemical vapor deposition (SVD). Insulation film 32 consists of silicon oxide film $32_1$ having a thickness of 1000 Å and silicon nitride film $32_2$ having a thickness of 3000 Å. Oxide film $32_1$ has been formed by thermal oxidizing the surface of silicon substrate 31. Nitride film $32_2$ has been formed on film $32_1$ by means of CVD. The polycrystalline silicon layer 33 can be doped with boron, either simultaneously with the CVD process, or by means of ion-implanatation after the CVD process. N-type epitaxial silicon substrate 31 corresponds to outer collector region 13 shown in FIG. 6.

Figure 9B:
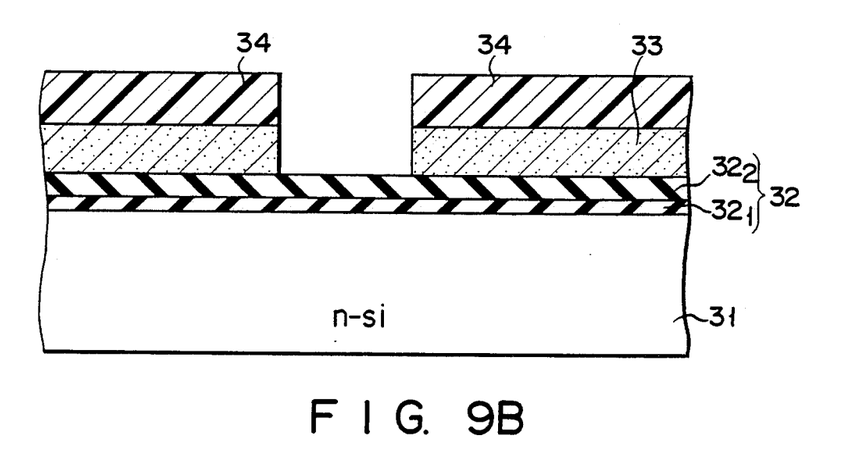
Figure 9C:
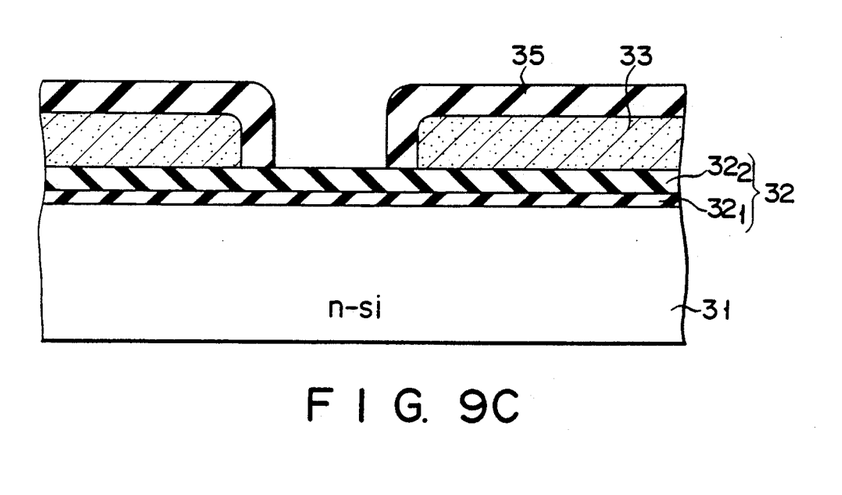

Thereafter, as is shown in FIG. 9B, resist pattern 34 having opening is formed on first polycrystalline silicon layer 33. Using this resist pattern as the etching mask, reactive ion etching (RIE) is conducted, thereby forming an opening in first polycrystalline silicon layer 33. Then, resist pattern 34 is removed from layer 33. Thermal oxidation is performed on first polycrystalline silicon layer 33, thereby forming oxide film 35 on layer 33 as is illustrated in FIG. 9C.

Figure 9D:
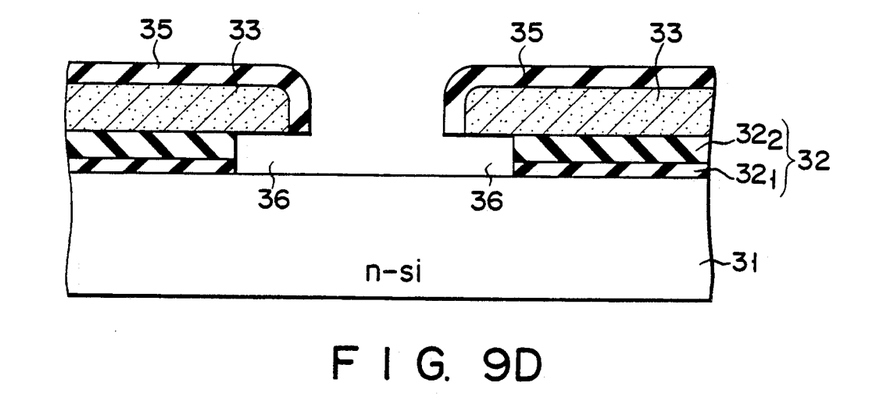
Figure 9E:
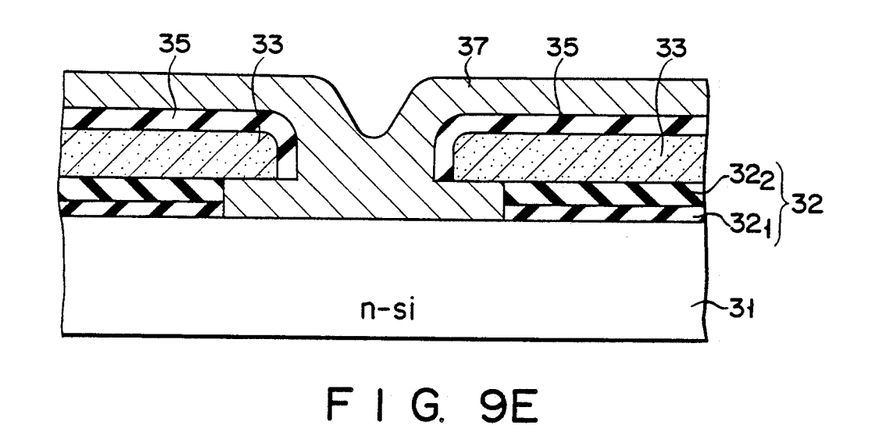

Next, nitride film $32_2$ and oxide film $32_1$ are etched by means of isotropy etching such that undercut 36 is formed as is shown in FIG. 9D. This etching consists of two steps. In the first step, nitride film $32_2$ is etched for a long time until a predetermined portion of film $32_2$ is etched away. In the second step, oxide film $32_1$ is etched by using the etched nitride film $32_2$ as the etching mask. Further, second polycrystalline silicon film 37, which is doped with no impurities, is formed as illustrated in FIG. 9E.

Figure 9F:
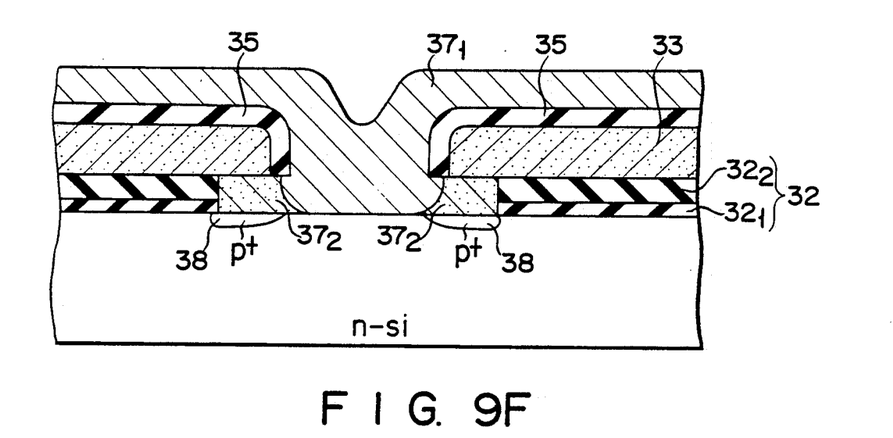

Then, heat treatment is conducted on the unfinished product, thus diffusing boron from first polycrystalline silicon layer 33 into part of second polycrystalline silicon film 37, and further into substrate 31, thereby forming p$^+$-type outer base region 38, as is illustrated in FIG. 9F. That part $37_2$ of silicon film 37 which has been doped with boron is located in undercut portion 36. The other part $37_1$ of film 37 remains undoped. The boron is diffused farther in the horizontal direction in the interface between film 37 and substrate 31 than in any other place. Due to this specific boron diffusion, doped portion $37_2$ has a slope.

Figure 9G:
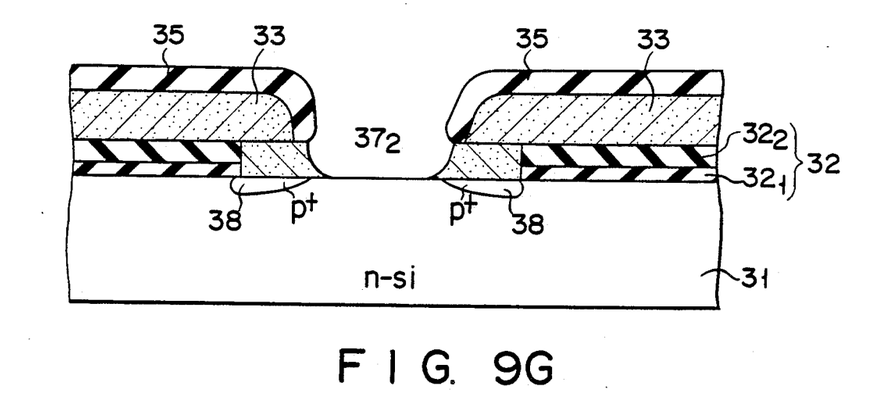

An etching solution containing hydrazine is applied, thus etching the undoped portion $37_1$ of second polycrystalline silicon film 37, and exposing a portion of substrate 31 as is illustrated in FIG. 9G. Undoped portion $37_1$ is etched at a higher rate than doped portion $37_2$. Hence, only region $37_1$ can be etched away as is shown in FIG. 9G, without using any etching mask. The inner wall of the opening defined by doped portion $37_2$ is inclined at a particular angle to the upper surface of substrate 31.

Figure 9H:
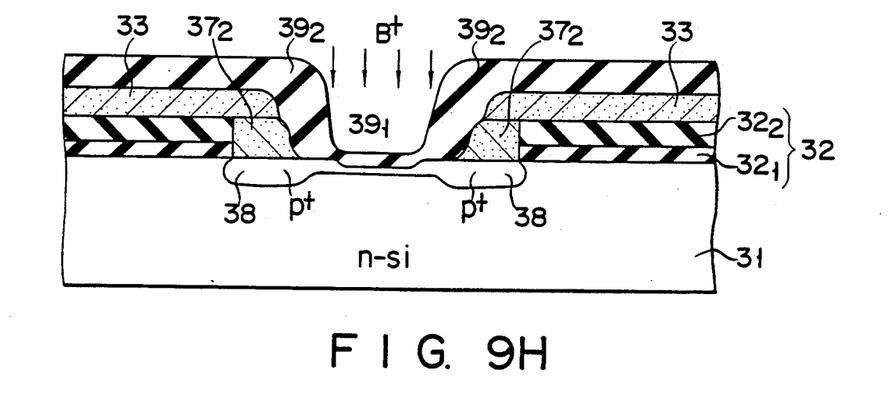

Thereafter, another thermal oxidation is performed, after either removing or not removing or not removing oxide film 35. As a result, oxide film $39_1$ is formed on the exposed portion of substrate 31, and also oxide film $39_2$ polycrystalline silicon films 33 and $37_2$, as is illustrated in FIG. 9H. Since doped polycrystalline silicon films 33 and $37_2$ are more readily oxidized than singlecrystal silicon substrate 31, oxide films $39_2$ covering polycrystalline silicon films 33 and $37_2$ is thicker than oxide film $39_1$ which covers the supper surface of substrate 31. Subsequently, boron is ion-implanted for forming an inner base region, as shown by arrows in FIG. 9H.

Figure 9I:
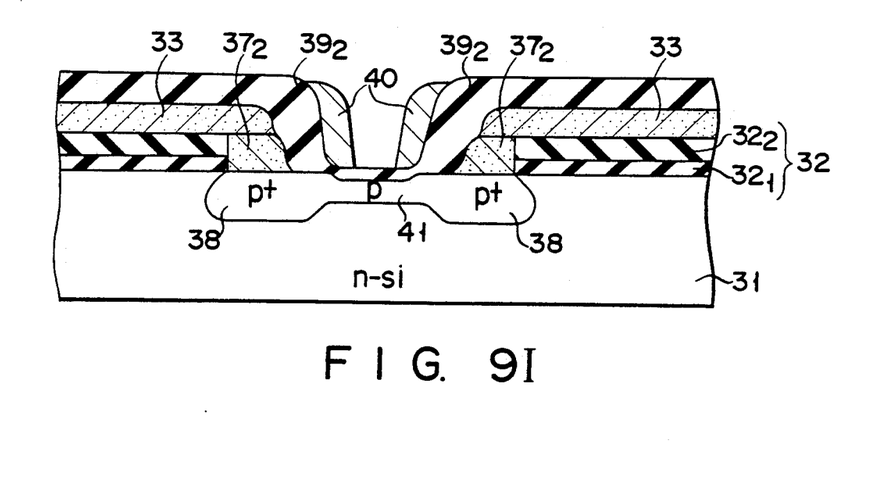

Next, undoped polycrystalline silicon film 40 is deposited by the CVD on the entire surface of the unfinished product. Then, this film 40 is etched back by RIE, and the film 40 is removed, except for that portion formed on the inner surface of the opening made in oxide film $39_2$ as is shown in FIG. 9I. Thus, the opening becomes narrower. Due to the heat applied during the CVD for depositing undoped polycrystalline silicon film 40, the ion-implanted boron is diffused into substrate 31, thereby forming P-type inner base region 41 in substrate 14 as is illustrated in FIG. 9I.

Figure 9J:
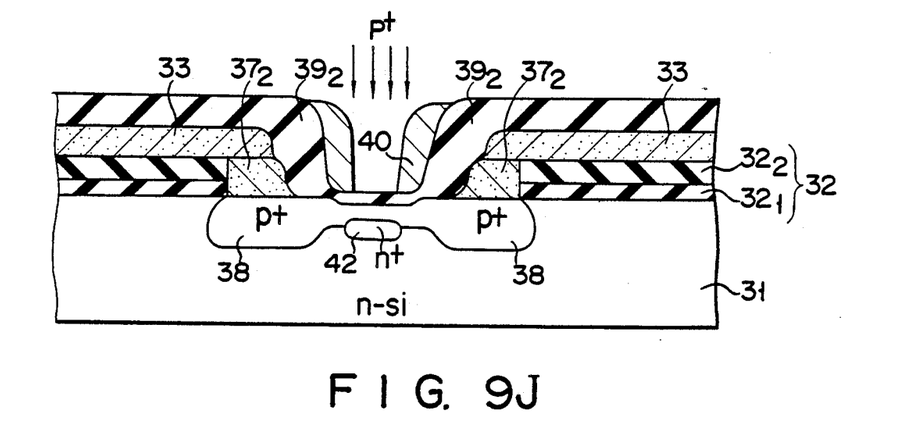

Then, as is shown in FIG. 9J, phosphorus is ionimplanted for forming inner collector region through the narrowed opening in the maximum concentration of $1 \times 10^{17}$ cm$^{-3}$. The unfinished product is heated, and the ion-implanted phosphorus is activated, thus forming N$^+$-type inner collector region 42 between inner base region 41 and N-type substrate 31.

Figure 9K:
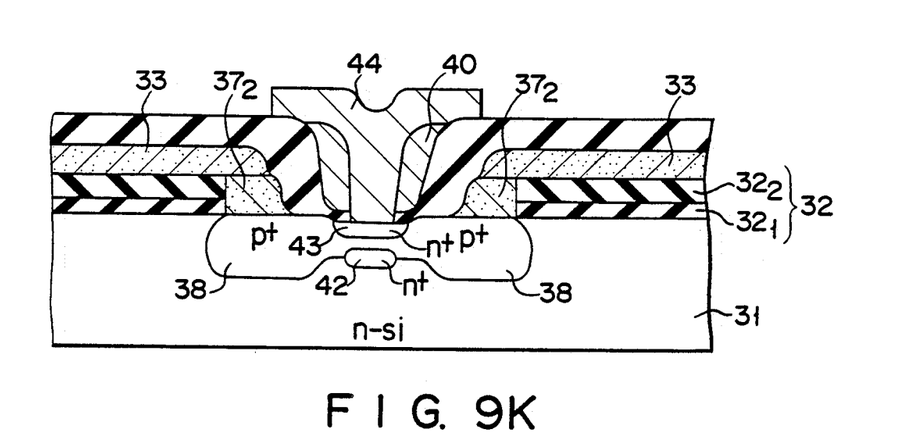

Next, thin oxide film $39_1$ is removed from that portion of substrate 31 which is exposed via the opening, by means of etching using HF as the etchant. Third polycrystalline silicon film 44, which is doped with arsenic in concentration of $1 \times 10^{20}$ cm$^{-3}$, is deposited on the entire surface of the unfinished product. Then, as is shown in FIG. 9K, third polycrystalline silicon film 44 is patterned. The unfinished product is heat-treated, whereby the arsenic is diffused into inner base region 41, thereby forming N$^+$-type emitter region 43. Although the diffusion coefficient of arsenic is smaller than that of phosphorus, formed emitter region 43 is broader than inner collector region 42. This is because the source of the arsenic, i.e., third polycrystalline silicon film 44, has an extremely high concentration of $1 \times 10^{20}$ cm$^{-3}$ whereas the phosphorus is ion-implanted in a low concentration of $1 \times 10^{17}$ cm$^{-3}$.

Figure 9L:
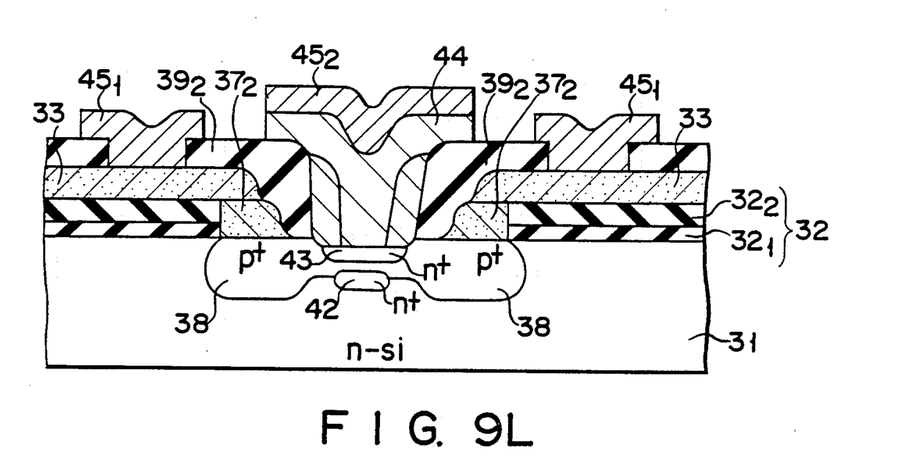

Lastly, contact holes are formed in oxide film $39_2$, and aluminum film is vapor-deposited on the entire surface of the unfinished product. The aluminum film is then patterned, thereby forming base electrodes $45_1$ and emitter electrode $45_2$, as is illustrated in FIG. 9L. Thus, a bipolar transistor essentially identical in structure to the bipolar transistor shown in FIG. 6 is manufactured.

EXAMPLE 2

As has been described, it is important to the invention that the inner collector region is less broad than the emitter region. The narrower the inner collector region, the better. In other words, the broader the emitter region than the inner collector region, the better. Emitter region 43 can be made broader by the following method.

Figure 10A:
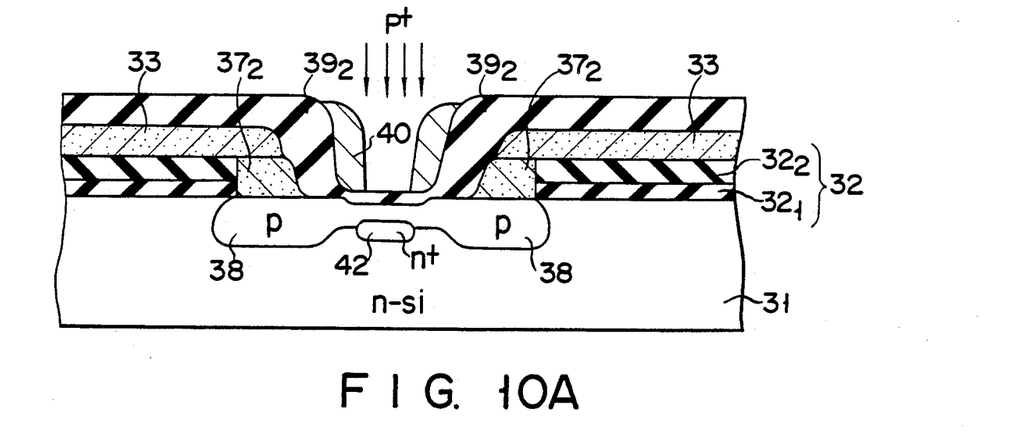
FIGS. 10A to 10C are cross sectional views explaining another method of manufacturing the bipolar transistor shown in FIG. 6.
Figure 10B:
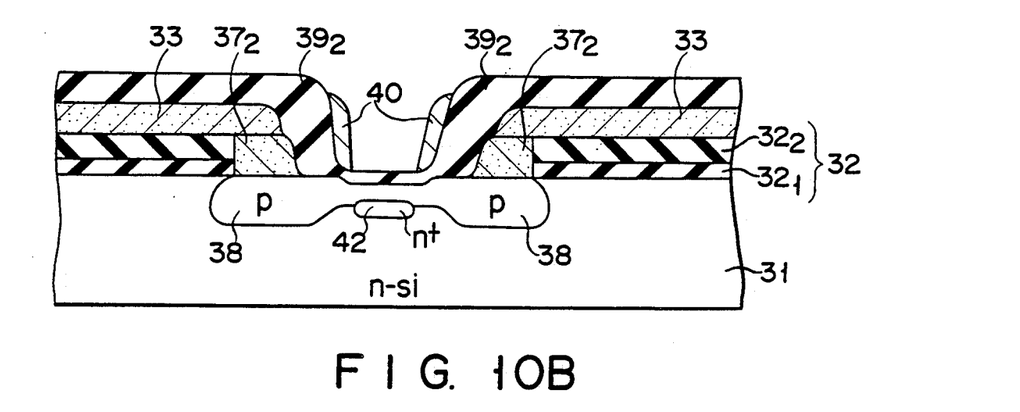
Figure 10C:
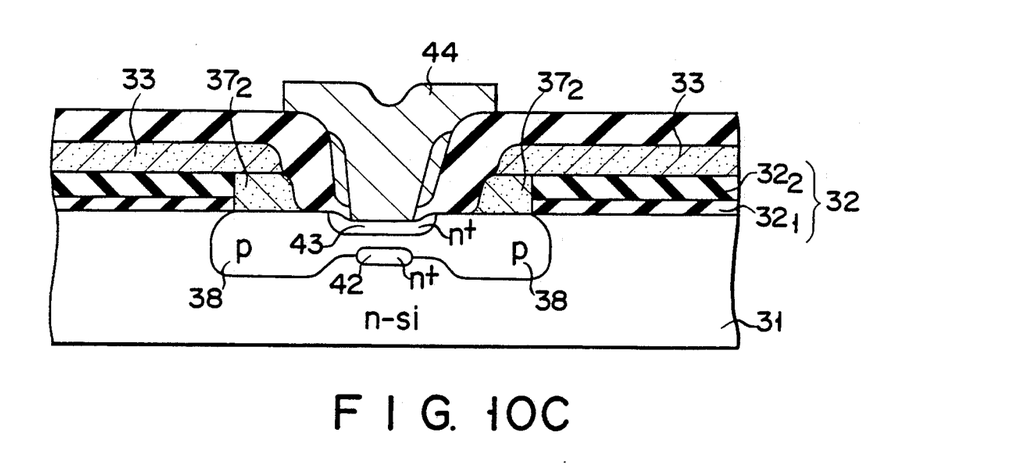

The steps explained with reference to FIGS. 9A to 9J are performed, thereby obtaining the structure shown in FIG. 10A. Anisotropic etching such as RIE is then carried out on tubular polycrystalline silicon film 40, thus widening the opening as is shown in FIG. 10B. Thereafter, third polycrystalline silicon film 44 is deposited on the entire surface of the unfinished product, exactly in the same way as in Example 1. Then, as is shown in FIG. 10C, film 44 is patterned and heattreated, thereby forming N$^+$-type emitter region 43 in outer base region 38. Since the arsenic is thermally diffused from third polycrystalline silicon film 44 into outer base region 38 through widened opening. Therefore, emitter region 43 is broader than in Example 1. Thereafter, the same steps are carried out as in Example 1, thereby manufacturing a bipolar transistor essentially identical to the transistor shown in FIG. 6.

The present invention is not limited to the embodiments described above. Rather, various changes and modifications can be made without departing the scope of the invention. For example, the invention can apply to a PNP transistor, instead of an NPN transistor as in the case of the above embodiments. Further, the material of the semiconductor substrate need not be limited to silicon. Still further, the method of manufacturing the bipolar transistor of the invention is not limited to Examples 1 and 2. For example, the inner collector region can be formed before forming the inner base region, not forming the inner base region first as in Examples 1 and 2.

What is claimed is:

1. A bipolar transistor comprising:
   an emitter region of a first conductivity type, having a predetermined width;
   an inner base region of a second conductivity type, formed below said emitter region and contacting said emitter region, thus forming a PN junction;
   an outer base region of a second conductivity type, having a high impurity concentration, set in contact with the side face of said inner base region and surrounding said inner base region;
   an inner collector region of the first conductivity type, formed below said inner base region and contacting the bottom face of said inner base region, thus forming a PN junction; and
   an outer collector region of the first conductivity type, set in contact with the bottom face of said inner collector region, contacting the bottom face of said outer base region, thus forming a PN junction, and surrounding said inner collector region,
   wherein said inner collector region has a higher impurity concentration than said outer collector region; the side edge of said inner collector region is located right below, or inner than, the side edge of said emitter region; and the top face of said inner collector region is higher and closer to said emitter region, than the top face of said outer collector region.

2. The bipolar transistor according to claim 1, further comprising a buried collector region of the first conductivity type, having a high impurity concentration, formed below said inner and outer collector region, and set in contact with the bottom face of said outer collector region.

3. A bipolar transistor comprising:
an emitter region of a first conductivity type, having a predetermined width;
an inner base region of a second conductivity type, formed below said emitter region and contacting said emitter region, thus forming a PN junction;
an outer base region of a second conductivity type, having a high impurity concentration, set in contact with the side face of said inner base region and surrounding said inner base region;
an inner collector region of the first conductivity type, formed below said inner base region and contacting the bottom face of said inner base region, thus forming a PN junction; and
an outer collector region of the first conductivity type, formed below said outer base region and said inner collector region, set in contact with the bottom face of said inner collector region, contacting the bottom face of said outer base region, thus forming a PNB junction,
wherein said inner collector region has a higher impurity concentration than said outer collector region; the side edge of said inner collector region is located right below, or inner than, the side edge of said emitter region; and the top face of said inner collector region is higher and closer to said emitter region, than the top face of said outer collector region.

4. The bipolar transistor according to claim 3, further comprising a buried collector region of the first conductivity type, having a high impurity concentration, formed below said outer collector region, and set in contact with the bottom face of said outer collector region.

5. The bipolar transistor according to claim 1, wherein the impurity concentrations of said inner and outer collector regions are lower than that of said emitter region.

6. The bipolar transistor according to claim 3, wherein the impurity concentrations of said inner and outer collector regions are lower than that of said emitter region.

* * * * *